Inventor:
Werner Pioch
by Michael J. Striker
Attorney

Sept. 20, 1966 W. PIOCH 3,274,449

ELECTRICAL APPARATUS COMPRISING PRINTED CIRCUIT BOARDS

Filed Nov. 12, 1963 3 Sheets-Sheet 2

Inventor:
Werner Pioch
by
Michael J. Striker
Attorney

ELECTRICAL APPARATUS COMPRISING PRINTED CIRCUIT BOARDS

Filed Nov. 12, 1963 3 Sheets-Sheet 3

Jnventor:
Werner Pioch
by Michael J. Striker
Attorney

United States Patent Office 3,274,449

Patented Sept. 20, 1966

3,274,449
ELECTRICAL APPARATUS COMPRISING PRINTED CIRCUIT BOARDS

Werner Pioch, Darmstadt-Eberstadt, Germany, assignor to Fernseh G.m.b.H., Darmstadt, Germany Filed Nov. 12, 1963, Ser. No. 322,629
Claims priority, application Germany, Nov. 13, 1962, F 38,298
10 Claims. (Cl. 317—101)

Figure 1:
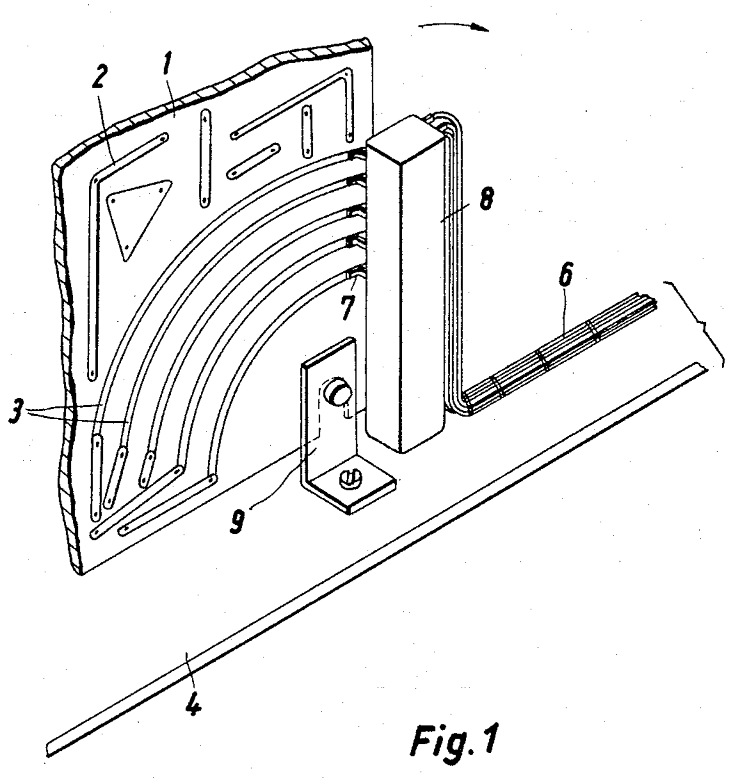

This invention relates to electrical apparatus comprising printed circuit boards and it is especially concerned with a contact arrangement for producing electrically conductive connections between a hingedly mounted circuit board and electrical wiring fixedly arranged in the apparatus.

In known apparatus electrical components mounted on printed circuit boards are connected with other electrical components by way of soldered contacts or by way of plug contacts. Plug contacts are preferred in order to make the printed circuit boards rapidly interchangeable in the apparatus.

In known apparatus of this kind, therefore, mounting means have been provided which surround the printed circuit boards in the form of metal frames. It is a disadvantage of such an apparatus that the cost of material and labour and also the weight of the apparatus are thus considerably increased.

In further known apparatus printed circuit boards are connected to each other by way of additional printed circuit boards and plug contacts. The disadvantage of this apparatus is that defective components can be replaced only by a very complicated operation involving much loss of time.

The purpose of the present invention is to avoid the disadvantages set out above which are encountered in known arrangements.

It is a broad object of the present invention to provide an advantageous construction of electrical apparatus which will permit rapid replacement of printed circuit boards.

It is another object of the present invention to provide such a contact arrangement used in electrical apparatus that a plurality of adjacently disposed printed circuit boards may be hinged out for purposes of measurement while in the operating condition, without this hinging-out of the boards stressing the connections of the cable harness fixed in the apparatus by which connection is made to the circuits carried on the circuit board.

According to the present invention there is provided electrical apparatus comprising a printed circuit board arranged for pivotal movement with respect to a relatively fixed portion of said apparatus, in which a plurality of electrical connections are made between respective conductors of a first set of conductors carried on said circuit board and a second set of conductors attached to said fixed portion of said apparatus, by the ends of one said set of conductors being connected to respective circularly curved contact strips having as centre of curvature the axis of said pivotal movement, said contact strips being resiliently engaged by respective contact members individually terminating the conductors of said second set.

In apparatus for electrical communications technique especially, the simple and easy exchange of printed circuit boards provided by the use of the invention proves to be very advantageous in order, for example, to be able to rectify as quickly as possible faults occasioned by components which have become faulty.

Figure 2:
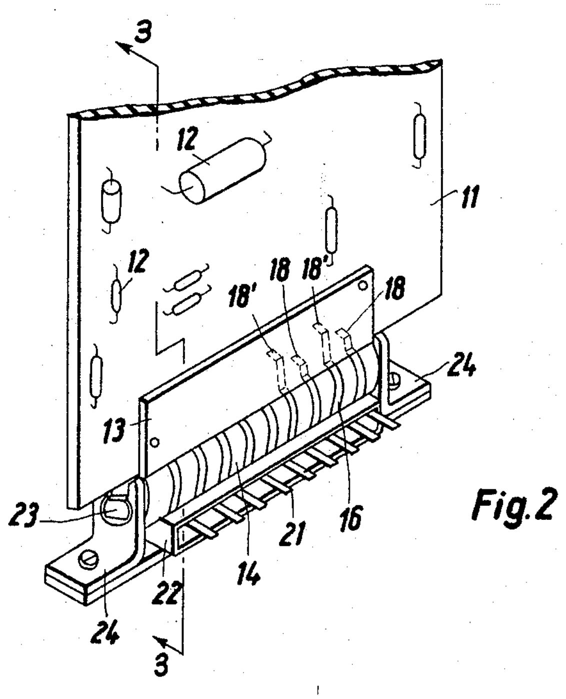
Figure 3:
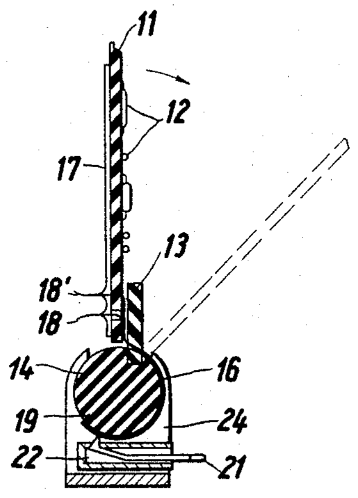
Figure 4:
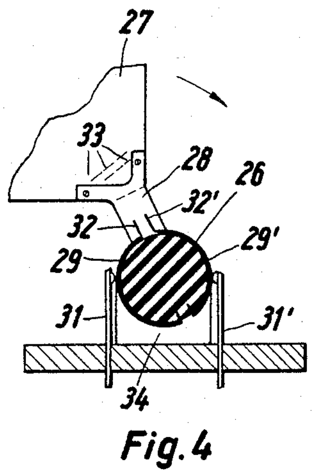
Figure 5:
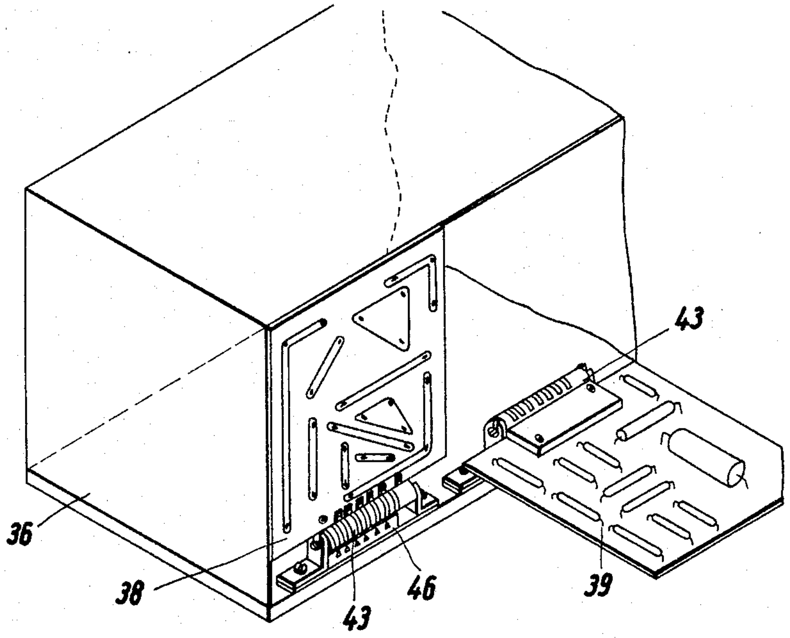
Figure 6:
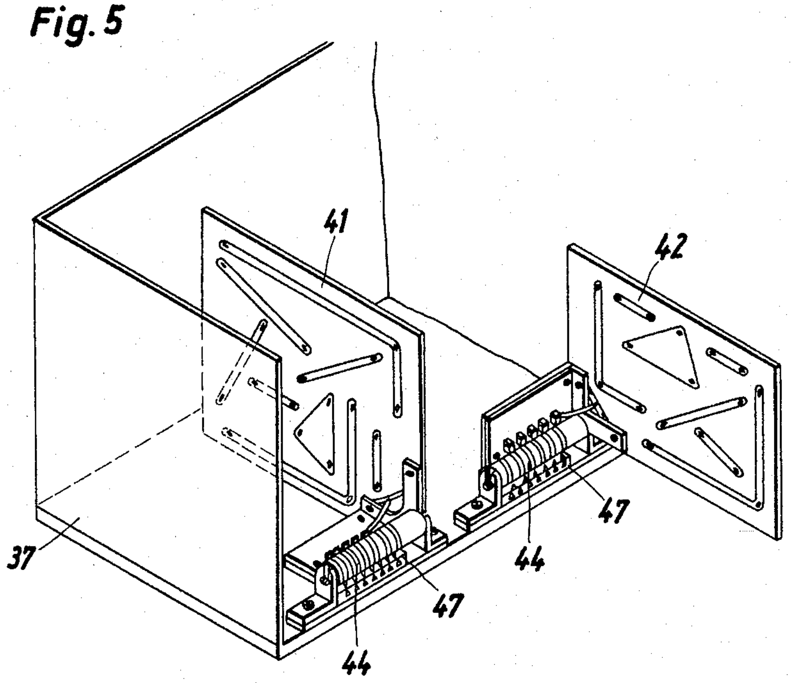

The novel features which are considered as characteristic for the invention are set forth in particular in the appended claims. The invention itself, however, both as to its construction and its method of operation together with additional objects and advantages thereof, will be best understood from the following description of specific embodiments when read in connection with the accompanying drawings, in which:

FIG. 1 is a perspective view of one embodiment of contact arrangement according to the invention, FIG. 2 is a perspective view of a further contact arrangement according to the invention, FIG. 3 is a cross-section along line 3—3 through the contact arrangement shown in FIG. 2, FIG. 4 is a section through another contact arrangement according to the invention, and FIGS. 5 and 6 are perspective views of alternative forms of telecommunications apparatus incorporating contact arrangement according to the present invention.

In all these drawings corresponding elements are designated by the same reference numerals.

In FIG. 1 there is illustrated a part of a circuit board 1 upon which are deposited conductive layers such as 2 forming a printed circuit. The ends of certain of these conductors, to which it is required to make electrical connection from circuits external to the printed circuit board are formed as circularly curved contact strips 3 having a common center of curvature lying in the axis of a pivot about which the circuit board may be hinged in its own plane. Contact between wires collected into a cable from 6 and the conductors of the printed circuit board is made by resiliently mounted contact members 7 forming part of a contact assembly 8. The pivot pin about which the circuit board may be hinged is secured on a bearing bracket 9. When the printed circuit board has been hinged through approximately 90° in the direction of the arrow it may be disengaged from the bearing bracket 9 and removed for servicing or for replacement by another board. Thus any defect arising in the operation of the circuits carried on the board may be easily and rapidly corrected by exchanging it for a similar, correctly operating board.

In the embodiment of the invention shown in FIG. 2 a circuit board 11 carrying electrical components such as 12 is secured with the help of a strip 13 of insulating material to a cylindrical member 14 also of insulating material which carries circularly curved contact strips such as 16 provided in accordance with the invention. As may be seen more clearly from FIG. 3, which represents a cross-section through the arrangement illustrated by FIG. 2, the electrical components 12 are disposed on the side of circuit board 11 opposite to that carrying the conductive strips such as 17 forming the printed circuit. The electrical components are connected by way of these contact strips with the ends of the curved contact strips shown in broken line at 18 and 18' in FIG. 2. The ends of the curved contact strips may advantageously be soldered to the connections of the electrical components 12 by the dip-soldering process. As may be seen from FIG. 3 the ends of the curved conductors are secured in a slit 19 in the cylindrical insulator 14.

In order to connect the printed circuits to those situated elsewhere in the apparatus of which the board forms a part the circularly curved contact strips 16 are resiliently contacted by the contact members 21 of a fixed contact assembly 22. The cylindrical insulating member 14 is pivotally mounted by means of extensions such as 23 engaging in bearing brackets 24 which are secured to the chassis of the apparatus (not shown).

On hinging the circuit board 11 in the direction indication by an arrow in FIG. 3 the curved contact strips 16 slide over the resiliently mounted contact members 21. If the circuit board is swung through some 90°, the extension 23 of the cylindrical member 14 may be disengaged from bearing bracket 24 by way of the slot in the latter and the whole circuit board and contact assembly may be removed for repair or replacement by another.

FIG. 4 shows a cross-section through another form of contact device suitable for use in electrical apparatus according to the invention in which the axis of rotation of a cylindrical insulating member 26 lies perpendicular to the plane of the circuit board 27, which is secured to the cylinder 26 by means of a mounting bracket 28. On the cylindrical member 26 are disposed opposed pairs of circularly curved contact strips such as 29, 29', which are in contact with resilient contact members 31, 31' respectively of a fixed contact assembly. The ends 32, 32' of contact strips 29, 29' may be connected by means of stiff wires or by coaxial cables, as appropriate to solder tags 33 leading to conductors of the printed circuit board itself. The cylindrical member 26 is rotatably mounted in a bearing bracket 32, so that the circuit board 27 fastened to it can be hinged in the direction of the arrow and may likewise be removed altogether as in the case of the circuit board illustrated in FIGS. 2 and 3.

FIG. 5 shows a portion of a communications apparatus employing printed circuit boards to which contact is made by arrangements as described in relation to FIGS. 2 and 3. A housing 36 contains two circuit boards 38, 39, of which the latter is shown hinged out for inspection or test. Each of the circuit boards 38, 39 is provided with a contact device 43 in the form of a cylindrical member carrying circularly curved contact strips to which contact assemblies such as 46 make resilient contact.

FIG. 6 shows a portion of a communications apparatus comprising a casing 37 containing two printed circuit boards 41, 42, each of which is provided with a cylindrical insulating member 44 carrying circularly curved contact strips to which sets of contact members 47 make resilient contact.

As has already been explained the use of arrangements such as have been described above for making contact to the circuits carried on the printed circuit boards provides the advantage that the risk of damage to soldered connections owing to bending of the associated conductors is avoided.

While the invention has been illustrated and described as embodied in an arrangement with electrically conductive connections between a hingedly mounted circuit board and electrical wiring fixedly arranged in the apparatus, it is not intended to be limited to the details shown, since various modifications and structural changes may be made without departing in any way from the spirit of the present invention. For example, the arrangements described may be modified in that the circularly curved contact strips may be disposed on a member mounted on the relatively fixed portion of the apparatus and the resilient contact members may be carried on the printed circuit board. The arrangements particularly described above are however generally preferred.

What is claimed as new and desired to be secured by Letters Patent is:

1. An electrical apparatus of the character described comprising, in combination, stationary support means; a printed circuit board supported on said support means for pivotable movement about an axis; a plurality of arcuate contact means fixedly connected to said circuit board for pivotal movement therewith and arranged concentrically with said axis; a plurality of resilient contact means carried by said support means and respectively resiliently contacting said plurality of arcuate contact means; connection means electrically connecting each of said plurality of arcuate contact means to respective points of a printed circuit on said printed circuit board; and conductor means connected to each of said plurality of resilient contact means.

2. An electrical apparatus as set forth in claim 1, wherein each of said conductor means comprises a terminal member fixed to said support means and an electrical connection between the respective resilient contact means and terminal member.

3. An electrical apparatus as set forth in claim 1, wherein said axis extends substantially normal to the plane of said printed circuit board and wherein said arcuate contact means are directly mounted on said printed circuit board.

4. An electrical apparatus of the character described comprising, in combination, stationary support means; a printed circuit board; a cylindrical member of insulating material rigidly secured to said circuit board, said cylindrical member being carried by said support means turnably about its axis; a plurality of arcuate contact means arranged spaced from each other in planes substantially normal to said axis about the surface of said cylindrical member fixed to the latter; a plurality of resilient contact means carried by said support means and respectively resiliently contacting said plurality of arcuate contact means; connection means electrically connecting each of said plurality of arcuate contact means to respective points of said printed circuit; and conductor means connected to each of said plurality of resilient contact means.

5. An electrical apparatus as set forth in claim 4, wherein each of said conductor means comprises a terminal member fixed to said support means and an electrical connection between the respective resilient contact means and terminal member.

6. An electrical apparatus as set forth in claim 4, wherein said cylindrical member is secured to one edge of said printed circuit board with its axis substantially parallel to said edge.

7. An electrical apparatus as set forth in claim 4, wherein said printed circuit board carries the printed circuits at one side of said board and including a plurality of electrical components carried on the other side of said board electrically connected to said printed circuits.

8. An electrical apparatus as set forth in claim 7 and including a plate of insulating material rigidly secured to said cylindrical member extending substantially parallel to the axis thereof and engaging said circuit board at said other side thereof fixedly connected thereto, and wherein each of said arcuate contact means is secured with one end thereof in a slit of said cylindrical member whereas the other end thereof is clamped between said circuit board and said plate.

9. An electrical apparatus as set forth in claim 4, wherein said plurality of arcuate contact means are arranged in pairs, one contact means of each pair extending over less than half of the circumference of said cylindrical member and the pairs of arcuate contact means being arranged spaced from each other along said cylindrical member in planes substantially normal to the axis of the latter, and wherein said resilient contact means are also arranged in pairs respectively contacting the pairs of arcuate contact means.

10. An electrical apparatus as set forth in claim 4, wherein said support means are constructed to support said cylindrical member and said printed circuit board carried thereby removably from said support means when said cylindrical member is turned about its axis to a specific angular position relative to said support means.

References Cited by the Examiner

UNITED STATES PATENTS 3,147,402 9/1964 Huchstetler ---------- 317—101

ROBERT S. MACON, *Acting Primary Examiner.*

KATHLEEN H. CLAFFY, *Examiner.*

J. J. BOSCO, *Assistant Examiner.*